United States Patent
Kim et al.

(10) Patent No.: US 11,838,020 B1
(45) Date of Patent: Dec. 5, 2023

(54) SEMICONDUCTOR MEMORY DEVICE INCLUDING WRITE DRIVER WITH POWER GATING STRUCTURES AND OPERATING METHOD THEREOF

(71) Applicant: SK hynix Inc., Gyeonggi-do (KR)

(72) Inventors: Woongrae Kim, Gyeonggi-do (KR); Yoo-Jong Lee, Gyeonggi-do (KR); A-Ram Rim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 114 days.

(21) Appl. No.: 17/179,615

(22) Filed: Feb. 19, 2021

Related U.S. Application Data

(63) Continuation-in-part of application No. 16/943,874, filed on Jul. 30, 2020, now Pat. No. 11,100,962, which is a continuation-in-part of application No. 16/232,205, filed on Dec. 26, 2018, now Pat. No. 10,943,626.

(60) Provisional application No. 62/610,452, filed on Dec. 26, 2017.

(51) Int. Cl.
*H03K 19/00* (2006.01)
*G11C 5/14* (2006.01)
*H03K 17/693* (2006.01)

(52) U.S. Cl.
CPC ........ *H03K 19/0016* (2013.01); *G11C 5/148* (2013.01); *H03K 17/693* (2013.01); *G11C 2207/2227* (2013.01); *H03K 2217/0081* (2013.01)

(58) Field of Classification Search
None
See application file for complete search history.

(56) References Cited

U.S. PATENT DOCUMENTS

| 4,962,487 | A | 10/1990 | Suzuki |
| 5,276,642 | A * | 1/1994 | Lee ...................... G11C 11/409 365/189.04 |
| 10,042,587 | B1 | 8/2018 | Pedersen |
| 10,943,626 | B1 | 3/2021 | Kim et al. |
| 2004/0027902 | A1 | 2/2004 | Ooishi et al. |
| 2005/0052931 | A1 | 3/2005 | Hardee |
| 2005/0052936 | A1 | 3/2005 | Hardee |
| 2005/0270074 | A1 | 12/2005 | Hardee |
| 2009/0259873 | A1 | 10/2009 | Oh |
| 2012/0042188 | A1 | 2/2012 | Hirano |
| 2014/0003181 | A1 | 1/2014 | Wang et al. |

(Continued)

FOREIGN PATENT DOCUMENTS

| KR | 10-0703720 | 4/2007 |
| KR | 10-1716965 | 3/2017 |
| KR | 10-1914296 | 11/2018 |

OTHER PUBLICATIONS

Office Action issued by the USPTO dated Feb. 14, 2022.

(Continued)

*Primary Examiner* — J. H. Hur
(74) *Attorney, Agent, or Firm* — IP & T GROUP LLP

(57) ABSTRACT

A semiconductor device includes a first circuit having a first power gating structure, a second circuit, and a third circuit having a second power gating structure that is different from the first power gating structure, and suitable for isolating the second circuit from the first circuit during a particular period.

9 Claims, 10 Drawing Sheets

(56) References Cited

U.S. PATENT DOCUMENTS

2018/0203643 A1    7/2018   Pedersen
2019/0050048 A1    2/2019   Kang et al.

OTHER PUBLICATIONS

Notice of Allowance for the U.S. Appl. No. 16/943,874 issued by the United States Patent and Trademark Office dated Jun. 16, 2021.

* cited by examiner

SEMICONDUCTOR MEMORY DEVICE INCLUDING WRITE DRIVER WITH POWER GATING STRUCTURES AND OPERATING METHOD THEREOF

CROSS-REFERENCE TO RELATED APPLICATION

This application is a continuation-in-part of U.S. patent application Ser. No. 16/943,874, filed on Jul. 30, 2020, which is a continuation-in-part of U.S. patent application Ser. No. 16/232,205, filed on Dec. 26, 2018, which claims the priority under 35 U.S.C. § 119 to U.S. Provisional Patent Application No. 62/610,452, filed on Dec. 26, 2017. The disclosure of each of the above-identified applications is incorporated herein by reference in its entirety.

BACKGROUND

1. Field

Various embodiments of the present invention relate to a semiconductor design technique, and more particularly, to a semiconductor device including a power gating circuit and a semiconductor system including the semiconductor device.

2. Description of the Related Art

Semiconductor devices should be designed to minimize unnecessary power consumption such as standby power. In particular, because many portable devices use batteries, which are of limited power supply, power consumption is an important design issue.

SUMMARY

Various embodiments of the present disclosure are directed to a semiconductor device in which a short circuit current does not occur in a power-down mode, and an operating method of the semiconductor device.

In accordance with an embodiment of the present invention, a semiconductor device may include: a first circuit having a first power gating structure; a second circuit; and a third circuit having a second power gating structure that is different from the first power gating structure, and suitable for isolating the second circuit from the first circuit during a particular period.

The third circuit may be coupled between the first circuit and the second circuit, and fix an input terminal of the second circuit to a predetermined voltage level during the particular period.

The first power gating structure may be a header-only type of power gating structure, and the second power gating structure may be a zigzag type of power gating structure.

At least one first power gating circuit included in the first power gating structure and at least one second power gating circuit included in the second power gating structure may be enabled during the particular period.

The third circuit may include: an isolation control circuit suitable for generating a control signal based on a first mode control signal and a second mode control signal; and an isolation circuit coupled between an output terminal of the first circuit and the input terminal of the second circuit, and suitable for fixing the input terminal of the second circuit to a predetermined voltage level based on the control signal.

The isolation circuit may include: a first power gating element coupled between a supply terminal of a first voltage and a supply terminal of a third voltage, and suitable for electrically decoupling the supply terminal of the first voltage from the supply terminal of the third voltage during the particular period; a second power gating element coupled between a supply terminal of a second voltage and a supply terminal of a fourth voltage, and suitable for electrically decoupling the supply terminal of the second voltage from the supply terminal of the fourth voltage during the particular period; a first driver coupled between the supply terminal of the first voltage and the supply terminal of the fourth voltage, and suitable for receiving an output signal of the first circuit; an isolation element coupled between the supply terminal of the fourth voltage and the first circuit, and suitable for electrically decoupling the supply terminal of the fourth voltage from the first circuit during the particular period based on the control signal; a keeping element coupled between the supply terminal of the first voltage and the output terminal of the first circuit, and suitable for electrically coupling the supply terminal of the first voltage to the output terminal of the first circuit during the particular period based on the control signal; and a second driver coupled between the supply terminal of the third voltage and the supply terminal of the second voltage, and suitable for receiving an output signal of the first driver.

The third circuit may include a third driver coupled between the supply terminal of the first voltage and the supply terminal of the second voltage and suitable for receiving an output signal of the isolation circuit, and the second driver may have a smaller size than the third driver.

The isolation control circuit may include: a first driving element suitable for driving a control terminal with the first voltage based on the first mode control signal; a second driving element suitable for driving the control terminal with the second voltage based on the second mode control signal; and a latch element coupled to the control terminal, and suitable for latching the control signal.

The isolation control circuit may further include an initialization element coupled between the supply terminal of the first voltage and the latch element, and suitable for initializing the control signal with the first voltage based on a power-up signal.

In accordance with an embodiment of the present invention, a semiconductor device may include: a memory block; and a write driving block having first and second power gating structures different from each other, and suitable for transmitting a data signal to the memory block during an operation period according to a write mode and fixing an input terminal of the memory block to a predetermined voltage level during a particular period.

The write driving block may include: a first circuit having the first power gating structure, and suitable for generating a first write data signal, which corresponds to the data signal, based on a data strobe signal; a second circuit suitable for transmitting a second write data signal to the memory block; and a third circuit having the second power gating structure, and suitable for generating the second write data signal, which corresponds to the first write data signal, during the operation period, and isolating the second circuit from the first circuit during the particular period.

In accordance with an embodiment of the present invention, a semiconductor device may include: a memory block; and a write driver coupled between a global line and a local line, and suitable for transmitting data, which is received through the global line, to the memory block through the local line, wherein the write drive includes: a first circuit coupled to the global line and having a first power gating structure suitable for receiving the data and outputting the data based on a power gating operation; a second circuit coupled to the local line; and a third circuit coupled between the first circuit and the second circuit, and suitable for receiving the data from the first circuit, transmitting the received data to the second circuit, and isolating the second circuit from the first circuit during a particular period associated with a power-down mode such that an input terminal of the second circuit is fixed to a set voltage level.

In accordance with an embodiment of the present disclosure, an operating method of a semiconductor device may include: entering a power-down mode; isolating a second circuit from a first circuit at a first time point; and cutting off the power of the first circuit at a second time point after a predetermined delay time elapses from the first time point.

The isolating of the second circuit from the first circuit may include fixing an input terminal of the second circuit to a predetermined voltage level.

DETAILED DESCRIPTION

Various embodiments of the present invention are described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention. Throughout the specification, reference to "an embodiment, "another embodiment" or the like is not necessarily to only one embodiment, and different references to any such phrase are not necessarily to the same embodiment(s).

Moreover, it is noted that the terminology used herein is for the purpose of describing the embodiments and is not intended to be limiting of the invention. As used herein, singular forms are intended to include the plural forms and vice versa, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component. Communication between two elements, whether directly or indirectly connected/coupled, may be wired or wireless, unless the context indicates otherwise.

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without departing from the spirit and scope of the present invention.

The drawings are not necessarily to scale and, in some instances, proportions may have been exaggerated in order to clearly illustrate features of the embodiments.

Figure 1A:
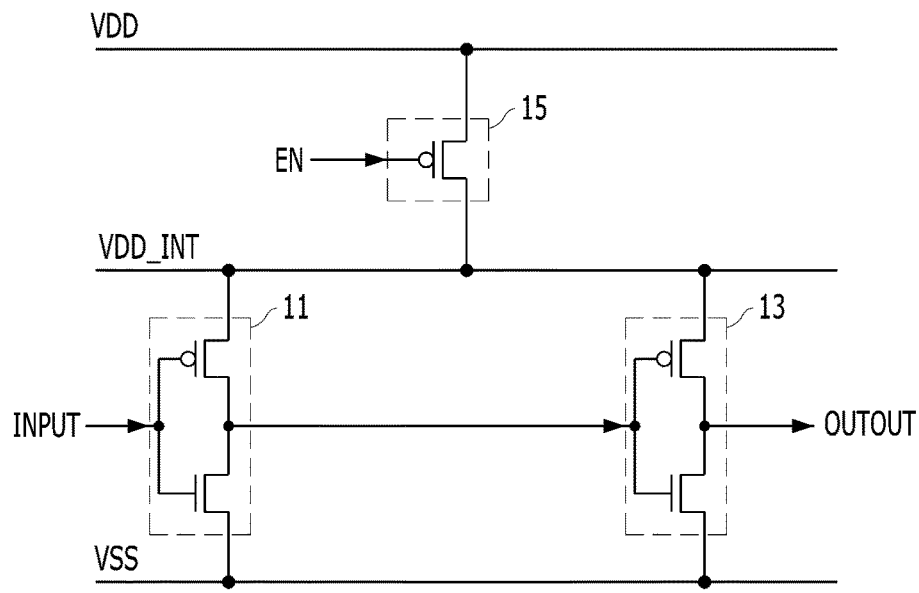
FIG. 1A is a block diagram illustrating an example of a power gating structure.
Figure 1B:
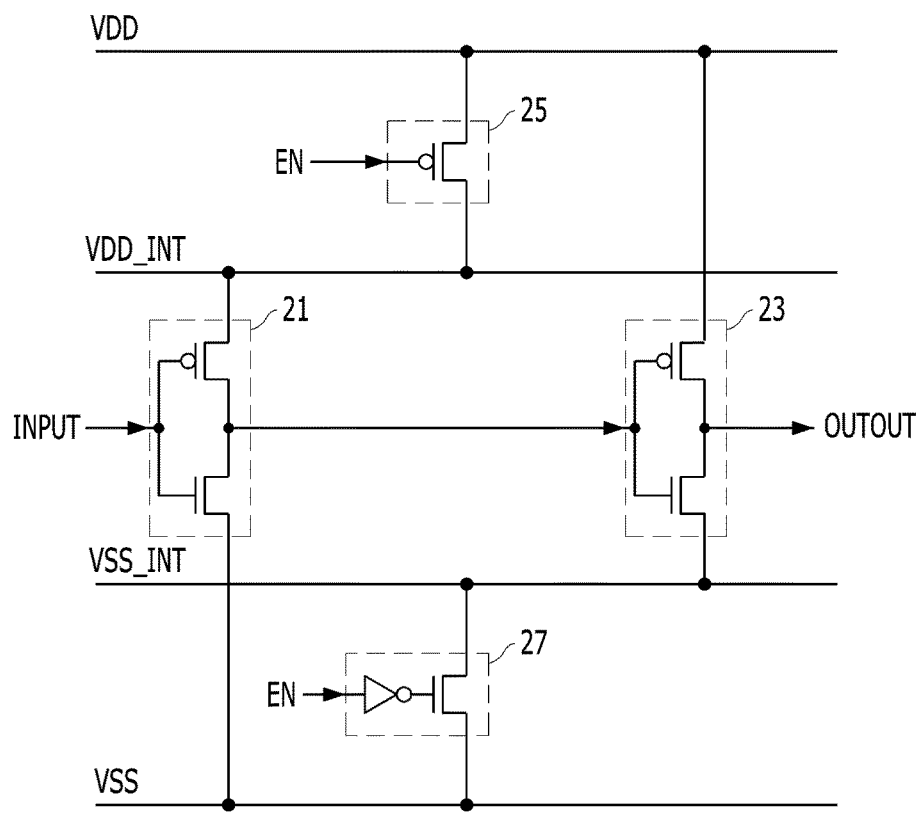
FIG. 1B is a block diagram illustrating another example of a power gating structure.

FIGS. 1A and 1B are block diagrams illustrating examples of power gating structures applied to embodiments of the present invention.

FIG. 1A is a block diagram illustrating a header-only type of power gating structure. FIG. 1B is a block diagram illustrating a zigzag type of power gating structure.

Referring to FIG. 1A, the header-only type of power gating structure may be designed so that a power source voltage VDD is selectively supplied to first and second logic circuits 11 and 13 and a ground voltage VSS is continuously supplied to the first and second logic circuits 11 and 13.

To this end, the header-only type of power gating structure may include, in addition to the first and second logic circuits 11 and 13, a power gating circuit 15. The power gating circuit 15 may be coupled between a supply terminal of the power source voltage VDD and a supply terminal of a high voltage VDD_INT. The first and second logic circuits 11 and 13 may be coupled between the supply terminal of the high voltage VDD_INT and a supply terminal of the ground voltage VSS.

The power gating circuit 15 may electrically connect the supply terminal of the power source voltage VDD to, or disconnect such supply terminal from, the supply terminal of the high voltage VDD_INT based on an enable signal EN. For example, the power gating circuit 15 may electrically connect the supply terminal of the power source voltage VDD to the supply terminal of the high voltage VDD_INT when the enable signal EN is deactivated. Further, the power gating circuit 15 may electrically disconnect the supply terminal of the power source voltage VDD from the supply terminal of the high voltage VDD_INT when the enable signal EN is activated.

The first and second logic circuits 11 and 13 may perform logic operations based on the power source voltage VDD supplied through the power gating circuit 15 and the ground voltage VSS supplied directly.

Although FIG. 1A illustrates, as an example, one power gating circuit 15 and two logic circuits 11 and 13, the present invention is not limited to this configuration.

The header-only type of power gating structure having the aforementioned structure may minimize area consumption, performance deterioration and signal distortion caused by the power gating circuit 15. Therefore, in an embodiment of the present invention, the header-only type of power gating structure may be applied to a data path.

Referring to FIG. 1B, the zigzag type of power gating structure may be designed so that a power source voltage VDD is selectively supplied to a first logic circuit 21 and the ground voltage VSS is continuously supplied to the first logic circuit 21, and the power source voltage VDD is continuously supplied to a second logic circuit 23 and the ground voltage VSS is selectively supplied to the second logic circuit 23.

To this end, the zigzag type of power gating structure may include, in addition to the first and second logic circuits 21 and 23, a first power gating circuit 25 and a second power gating circuit 27. The first power gating circuit 25 may be coupled between a supply terminal of the power source voltage VDD and a supply terminal of a high voltage VDD_INT. The second power gating circuit 27 may be coupled a supply terminal of the ground voltage VSS and a supply terminal of a low voltage VSS_INT. The first logic circuit 21 may be coupled between the supply terminal of the high voltage VDD_INT and the supply terminal of the ground voltage VSS. The second logic circuit 23 may be coupled between the supply terminal of the power source voltage VDD and the supply terminal of the low voltage VSS_INT.

The first power gating circuit 25 may electrically connect the supply terminal of the power source voltage VDD to, or disconnect such supply terminal from, the supply terminal of the high voltage VDD_INT based on an enable signal EN. For example, the first power gating circuit 25 may electrically connect the supply terminal of the power source voltage VDD to the supply terminal of the high voltage VDD_INT when the enable signal EN is deactivated. Further, the first power gating circuit 25 may electrically disconnect the supply terminal of the power source voltage VDD from the supply terminal of the high voltage VDD_INT when the enable signal is activated.

The second power gating circuit 27 may electrically connect the supply terminal of the low voltage VSS_INT to, or disconnect such supply terminal from, the supply terminal of the ground voltage VSS based on the enable signal EN. For example, the second power gating circuit 27 may electrically connect the supply terminal of the low voltage VSS_INT to the supply terminal of the ground voltage VSS based on the deactivated enable signal EN. Further, the second power gating circuit 27 may electrically disconnect the supply terminal of the low voltage VSS_INT from the supply terminal of the ground voltage VSS based on the activated enable signal EN.

The first logic circuit 21 may perform a logic operation based on the power source voltage VDD supplied through the first power gating circuit 25 and the ground voltage VSS supplied directly.

The second logic circuit 23 may perform a logic operation based on the power source voltage VDD supplied directly and the ground voltage VSS supplied through the second power gating circuit 27.

Although FIG. 1B illustrates, as an example, one first power gating circuit 25, one second power gating circuit 27 and two logic circuits 21 and 23, the present invention is not limited to this configuration.

The zigzag type of power gating structure having the aforementioned structure may decrease a leakage current on a level similar to the header-only type of power gating structure while a logic state of an output terminal may be maintained without floating depending on a logic state of an input terminal in a set mode. Therefore, in an embodiment of the present invention, the zigzag type of power gating structure may be applied to a control path.

Figure 2:
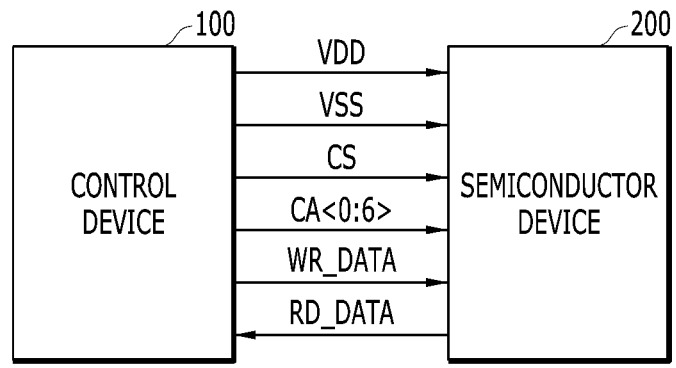
FIG. 2 is a block diagram illustrating a semiconductor system in accordance with an embodiment of the present invention.

FIG. 2 is a block diagram illustrating a semiconductor system in accordance with an embodiment of the present invention.

Referring to FIG. 2, the semiconductor system may include a control device 100 and a semiconductor device 200.

The control device 100 may output system control signals CS and CA<0:6> to the semiconductor device 200 based on the mode in which the semiconductor device 200 is in. The mode may include any one of a power-down mode PDE, an active mode ACT, a write mode WR and a read mode RD. The system control signals CS and CA<0:6> may include a chip selection signal CS and first to seventh command/address signals CA<0:6>. The system control signals CS and CA<0:6> corresponding to the respective modes may be generated as shown in the following Table 1.

TABLE 1

| | CS | CA<0> | CA<1> | CA<2> | CA<3> | CA<4> | CA<5> | CA<6> |
|---|---|---|---|---|---|---|---|---|
| PDE | H | L | L | L | L | L | L | H |
| WR | H | L | H | H | C2 | C3 | C4 | C5 |
| RD | H | H | L | B3 | C2 | C3 | C4 | C5 |

As shown in Table 1, the control device 100 may operate in the mode through a combination of all or some of the system control signals CS and CA<0:6>. For example, according to the power-down mode PDE, the control device 100 may generate the chip selection signal CS having a logic high level H, the first command/address signal CA<0> having a logic low level L, the second command/address signal CA<1> having the logic low level L, the third command/address signal CA<2> having the logic low level L, the fourth command/address signal CA<3> having the logic low level L, the fifth command/address signal CA<4> having the logic low level L, the sixth command/address signal CA<5> having the logic low level L and the seventh command/address signal CA<6> having the logic high level H. According to the write mode WR, the control device 100 may generate the chip selection signal CS having the logic high level H, the first command/address signal CA<0> having the logic low level L, the second command/address signal CA<1> having the logic high level H and the third command/address signal CA<2> having the logic high level H. In this case, the control device 100 may generate the fourth to seventh command/address signals CA<3:6> having specific information C2, C3, C4 and C5 together according to the write mode WR. Each of the specific information C2, C3, C4 and C5 may include address information required for the write mode WR or information for other function. According to the read mode RD, the control device 100 may generate the chip selection signal CS having the logic high level H, the first command/address signal CA<0> having the logic high level H and the second command/address signal CA<1> having the logic low level L. In this case, the control device 100 may generate the third to seventh command/address signals CA<2:6> having specific information B3, C2, C3, C4 and C5 together according to the read mode RD. Each of the specific information B3, C2, C3, C4 and C5 may include address information required for the read mode RD and information for other function.

Although it is described above that the modes include the power-down mode PDE, the write mode WR or the read mode RD, the present invention is not limited to this.

The control device 100 may output a write data signal WR_DATA to the semiconductor device 200 in the write mode WR. Further, the control device 100 may receive a read data signal RD_DATA from the semiconductor device 200 in the read mode RD.

The control device 100 may supply a power source voltage VDD and a ground voltage VSS to the semiconductor device 200.

The semiconductor device 200 may perform the power gating operation based on the system control signals CS and CA<0:6> when entering a particular mode. For example, the semiconductor device 200 may include a power gating circuit, and may disable the power gating circuit when entering a particular mode, which will be described in detail below.

Figure 3:
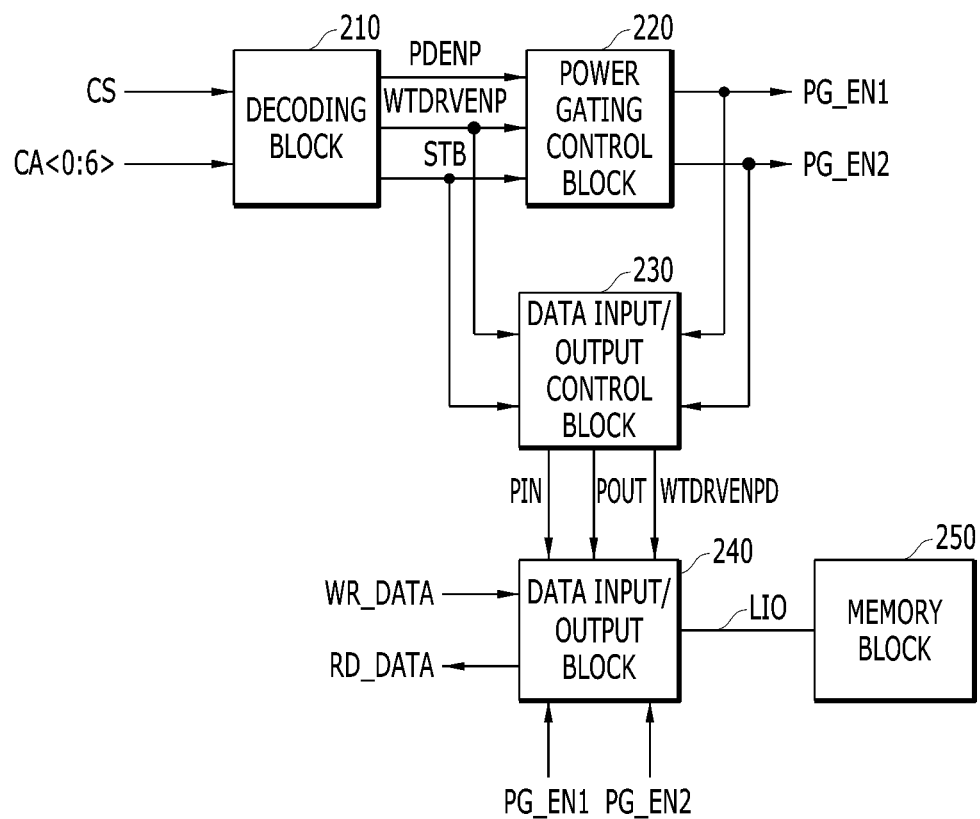
FIG. 3 is a block diagram illustrating a semiconductor device, such as that shown in FIG. 2, in accordance with an embodiment of the present invention.

FIG. 3 is a block diagram illustrating a semiconductor device, e.g., the semiconductor device 200 shown in FIG. 2, in accordance with an embodiment of the present invention.

Referring to FIG. 3, the semiconductor device 200 may include a decoding block 210, a power gating control block 220, a data input/output control block 230, a data input/output block 240, and a memory block 250.

The decoding block 210 may generate enable signals PDENP, WTDRVENP and STB according to the set mode based on the system control signals CS and CA<0:6>. For example, the decoding block 210 may activate a power-down enable signal PDENP during a power-down period corresponding to the power-down mode PDE when a combination of the system control signals CS and CA<0:6> represents the power-down mode PDE. The decoding block 210 may activate a write enable signal WTDRVENP during a write period corresponding to the write mode WR when a combination of some signals CS and CS<0:2> of the system control signals CS and CA<0:6> represents the write mode WR. The decoding block 210 may activate a read enable signal STB during a read period corresponding to the read mode RD when a combination of some signals CS and CS<0:1> of the system control signals CS and CA<0:6> represents the read mode RD.

The power gating control block 220 may generate first and second enable signals PG_EN1 and PG_EN2 for controlling the power gating operation according to the set mode based on the power-down enable signal PDENP, the write enable signal WTDRVENP and the read enable signal STB. For example, the power gating control block 220 may activate the first and second enable signals PG_EN1 and PG_EN2 during the power-down period based on the power-down enable signal PDENP which is activated. The power gating control block 220 may activate the first enable signal PG_EN1 and deactivate the second enable signal PG_EN2 during the write period based on the write enable signal WTDRVENP which is activated. The power gating control block 220 may activate the second enable signal PG_EN2 and deactivate the first enable signal PG_EN1 during the read period based on the read enable signal STB which is activated.

The data input/output control block 230 may generate control signals PIN, POUT and WTDRVENPD based on the write enable signal WTDRVENP, the read enable signal STB and the first and second enable signals PG_EN1 and PG_EN2. First and second read control signals PIN and POUT may be related to the read mode RD, and a write control signal WTDRVENPD may be related to the write mode WR.

The data input/output block 240 may receive the write data signal WR_DATA and output the read data signal RD_DATA based on the control signals PIN, POUT and WTDRVENPD and the first and second enable signals PG_EN1 and PG_EN2.

The memory block 250 may be coupled to the data input/output block 240 through a local input/output line LIO. The memory block 250 may write a data signal, which corresponds to the write data signal WR_DATA, received through the local input/output line LIO and read a data signal, which corresponds to the read data signal RD_DATA, through the local input/output line LIO.

Figure 4:
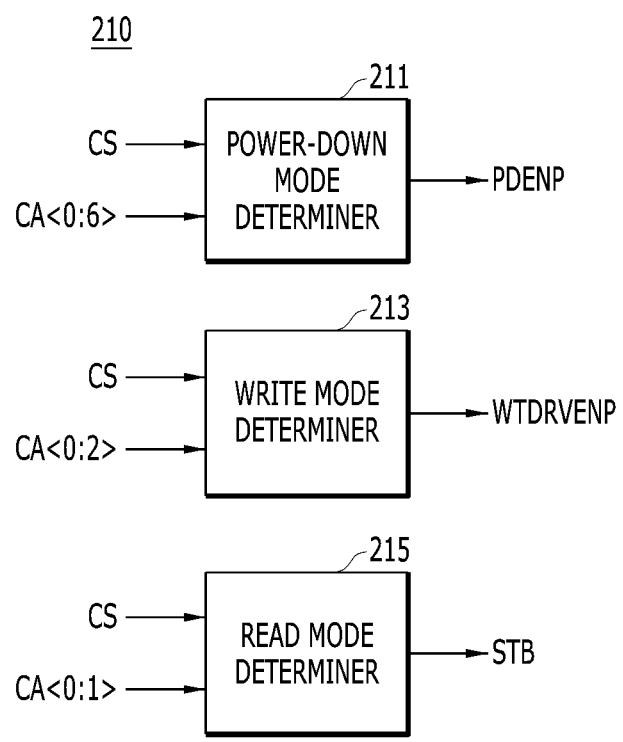
FIG. 4 is a block diagram illustrating a decoding block, such as that shown in FIG. 3, in accordance with an embodiment of the present invention.

FIG. 4 is a block diagram illustrating a decoding block, e.g., the decoding block 210 shown in FIG. 3, in accordance with an embodiment of the present invention.

Referring to FIG. 4, the decoding block 210 may include a power-down mode determiner 211, a write mode determiner 213, and a read mode determiner 215.

The power-down mode determiner 211 may generate the power-down enable signal PDENP, which is activated during the power-down period and deactivated during the read period, based on the system control signals CS and CA<0:6>. For example, the power-down mode determiner 211 may activate the power-down enable signal PDENP to a logic high level during the power-down period and deactivate the power-down enable signal PDENP to a logic low level during the write and read periods.

The write mode determiner 213 may generate the write enable signal WTDRVENP, which is activated during the write period and deactivated during the power-down period and the read period, based on some signals CS and CA<0:2> of the system control signals CS and CA<0:6>. For example, the write mode determiner 213 may activate the write enable signal WTDRVENP to a logic high level during the write period and deactivate the write enable signal WTDRVENP to a logic low level during the power-down period and the read period.

The read mode determiner 215 may generate the read enable signal STB, which is activated during the read period and deactivated during the power-down period and the write period, based on some signals CS and CA<0:1> of the system control signals CS and CA<0:6>. For example, the read mode determiner 215 may activate the read enable signal STB to a logic high level during the read period and deactivate the read enable signal STB to a logic low level during the power-down period and the write period.

Figure 5:
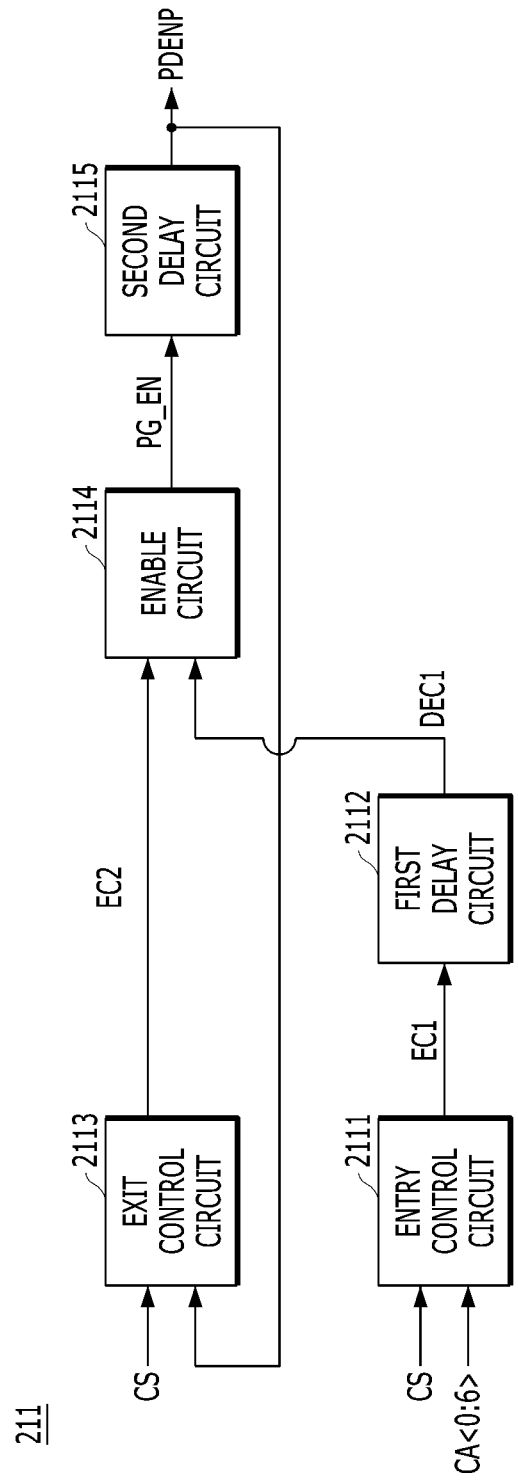
FIG. 5 is a block diagram illustrating a power-down mode determiner, such as that shown in FIG. 4, in accordance with an embodiment of the present disclosure.

FIG. 5 is a block diagram illustrating a power-down mode determiner, e.g., the power-down mode determiner 211 shown in FIG. 4, in accordance with an embodiment of the present disclosure.

Referring to FIG. 5, the power-down mode determiner 211 may include an entry control circuit 2111, a first delay circuit 2112, an exit control circuit 2113, an enable circuit 2114 and a second delay circuit 2115.

The entry control circuit 2111 may generate an entry control signal EC1 based on the chip selection signal CS and the first to seventh command/address signals CA<0:6>. For example, the entry control circuit 2111 may activate the entry control signal EC1 according to the combination of the first to seventh command/address signals CA<0:6> when the chip selection signal CS toggles for the first time. The entry control signal EC1 may be a signal related to the entry to the power-down mode PDE.

The first delay circuit 2112 may delay the entry control signal EC1 by a predetermined delay time, and generate a delayed entry control signal DEC1.

The exit control circuit 2113 may generate an exit control signal EC2 based on the chip selection signal CS and the power-down enable signal PDENP. For example, the exit control circuit 2113 may be enabled based on the power-down enable signal PDENP, and activate the exit control signal EC2 when the chip selection signal CS toggles for the second time. The exit control signal EC2 may be a signal related to the exit from the power-down mode PDE.

The enable circuit 2114 may generate a power-down control signal PG_EN based on the delayed entry control signal DEC1 and the exit control signal EC2.

The second delay circuit 2115 may delay the power-down control signal PG_EN by a predetermined delay time, and generate the power-down enable signal PDENP.

Figure 6:
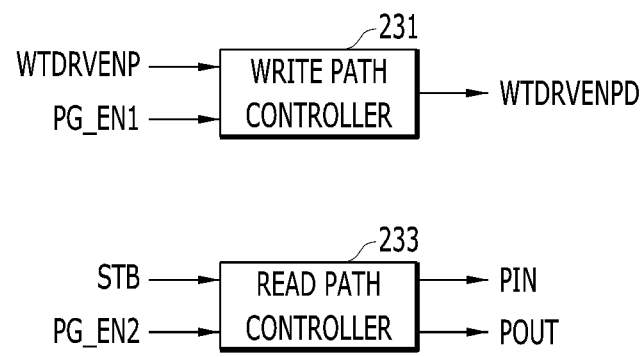
FIG. 6 is a block diagram illustrating a data input/output control block, such as that shown in FIG. 3, in accordance with an embodiment of the present invention.

FIG. 6 is a block diagram illustrating a data input/output control block, e.g., the data input/output control block 230 shown in FIG. 3, in accordance with an embodiment of the present invention.

Referring to FIG. 6, the data input/output control block 230 may include a write path controller 231, and a read path controller 233.

The write path controller 231 may generate the write control signal WTDRVENPD based on the write enable signal WTDRVENP and the first enable signal PG_EN1. For example, the write path controller 231 may activate the write control signal WTDRVENPD during the write period and deactivate the write control signal WTDRVENPD during the read period and the power-down period.

The read path controller 233 may generate the first and second read control signals PIN and POUT based on the read enable signal STB and the second enable signal PG_EN2. For example, the read path controller 233 may activate the first and second read control signals PIN and POUT during the read period and deactivate the first and second read control signals PIN and POUT during the write period and the power-down period.

Figure 7:
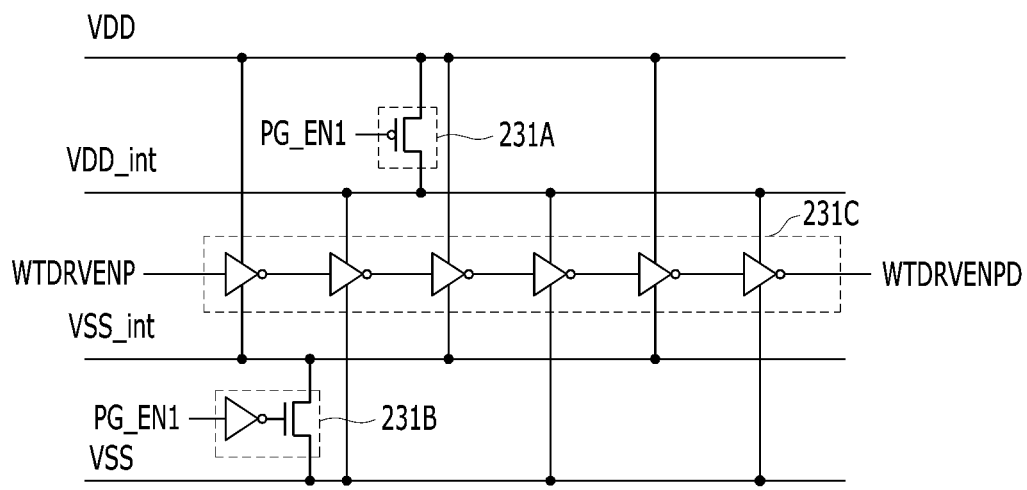
FIG. 7 is a diagram illustrating a write path controller, such as that shown in FIG. 6, in accordance with an embodiment of the present invention.

FIG. 7 is a diagram illustrating a write path control, e.g., the write path controller 231 shown in FIG. 6, in accordance with an embodiment of the present invention.

Referring to FIG. 7, the write path controller 231 may include a first power gating circuit 231A, a second power gating circuit 231B, and a first logic circuit 231C. In other words, the write path controller 231 may have the zigzag type of power gating structure.

The first power gating circuit 231A may be coupled between a supply terminal of the power source voltage VDD and a supply terminal of a high voltage VDD_int. The first power gating circuit 231A may electrically connect the supply terminal of the power source voltage VDD to, or disconnect such supply terminal from, the supply terminal of the high voltage VDD_int based on the first enable signal PG_EN1. When the supply terminal of the power source voltage VDD is electrically connected to the supply terminal of the high voltage VDD_int through the first power gating circuit 231A, the supply terminal of the high voltage VDD_int may have almost the same voltage level as the power source voltage VDD. For example, the high voltage VDD_int may correspond to a difference between the power source voltage VDD and a threshold voltage of a transistor included in the first power gating circuit 231A. When the supply terminal of the power source voltage VDD is electrically disconnected from the supply terminal of the high voltage VDD_int by the first power gating circuit 231A, the supply terminal of the high voltage VDD_int may be in a floating state.

The second power gating circuit 231B may be coupled between a supply terminal of the ground voltage VSS and a supply terminal of a low voltage VSS_int. The second power gating circuit 231B may electrically connect the supply terminal of the ground voltage VSS to, or disconnect such supply terminal from, the supply terminal of the low voltage VSS_int based on the first enable signal PG_EN1. When the supply terminal of the ground voltage VSS is electrically connected to the supply terminal of the low voltage VSS_int through the second power gating circuit 231B, the supply terminal of the low voltage VSS_int may have almost the same voltage level as the ground voltage VSS. For example, the low voltage VSS_int may correspond to a difference between the ground voltage VSS and a threshold voltage of a transistor included in the second power gating circuit 231B. When the supply terminal of the ground voltage VSS is electrically disconnected from the supply terminal of the low voltage VSS_int by the second power gating circuit 231B, the supply terminal of the low voltage VSS_int may be in a floating state.

The first logic circuit 231C may be coupled to the supply terminal of the power source voltage VDD, the supply terminal of the ground voltage VSS, the supply terminal of the high voltage VDD_int and the supply terminal of the low voltage VSS_int. For example, the first logic circuit 231C may include a plurality of logic elements, for example, an inverter, that are coupled in series to each other. Odd-numbered logic elements of the logic elements may be coupled between the supply terminal of the power source voltage VDD and the supply terminal of the low voltage VSS_int. Even-numbered logic elements of the logic elements may be coupled between the supply terminal of the high voltage VDD_int and the supply terminal of the ground voltage VSS. The first logic circuit 231C may delay the write enable signal WTDRVENP by a set delay time to generate the write control signal WTDRVENPD. In other words, the first logic circuit 231C may generate the write control signal WTDRVENPD which is activated after the write enable signal WTDRVENP is activated and the delay time passes, during the write period. In addition, the first logic circuit 231C may generate the write control signal WTDRVENPD which is deactivated based on the write enable signal WTDRVENP which is deactivated, during the read period and the power-down period. The write control signal WTDRVENPD may be kept in a deactivated state during the read period and the power-down period because the plurality of logic elements included in the first logic circuit 231C are coupled in the zigzag type between the supply terminal of the power source voltage VDD and the supply terminal of the ground voltage VSS.

Figure 8:
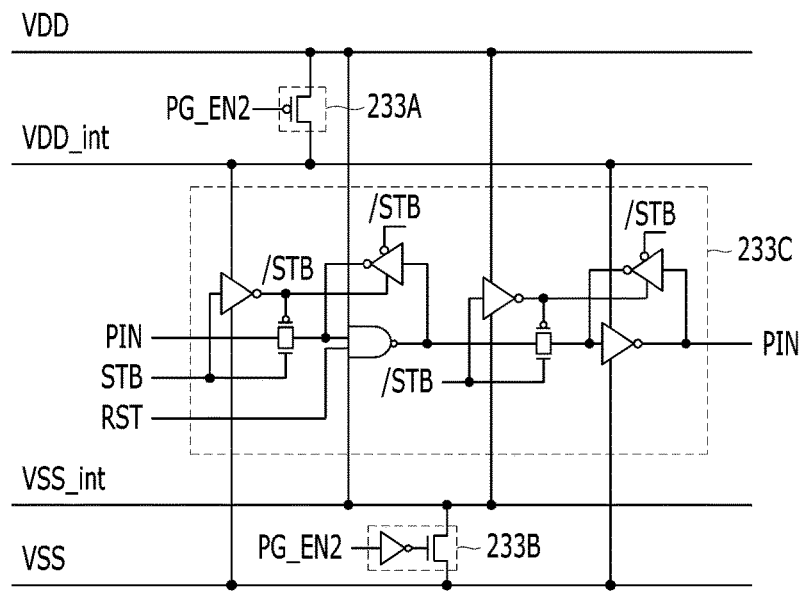
FIG. 8 is a diagram illustrating a read path controller, such as that shown in FIG. 6, in accordance with an embodiment of the present invention.

FIG. 8 is a diagram illustrating a read path control, e.g., the read path controller 233 shown in FIG. 6, in accordance with an embodiment of the present invention. For clarity, FIG. 8 illustrates just a circuit for generating the first read control signal PIN.

Referring to FIG. 8, the read path controller 233 may include a third power gating circuit 233A, a fourth power gating circuit 233B, and a second logic circuit 233C. In other words, the read path controller 233 may have the zigzag type of power gating structure.

The third power gating circuit 233A may be coupled between the supply terminal of the power source voltage VDD and the supply terminal of the high voltage VDD_int. The third power gating circuit 233A may electrically connect the supply terminal of the power source voltage VDD to, or disconnect such supply terminal from, the supply terminal of the high voltage VDD_int based on the second enable signal PG_EN2. When the supply terminal of the power source voltage VDD is electrically connected to the supply terminal of the high voltage VDD_int through the third power gating circuit 233A, the supply terminal of the high voltage VDD_int may have almost the same voltage level as the power source voltage VDD. For example, the high voltage VDD_int may correspond to a difference between the power source voltage VDD and a threshold voltage of a transistor included in the third power gating circuit 233A. When the supply terminal of the power source voltage VDD is electrically disconnected from the supply terminal of the high voltage VDD_int by the third power gating circuit 233A, the supply terminal of the high voltage VDD_int may be in a floating state.

The fourth power gating circuit 233B may be coupled between the supply terminal of the ground voltage VSS and the supply terminal of the low voltage VSS_int. The fourth power gating circuit 233B may electrically connect the supply terminal of the ground voltage VSS to, or disconnect such supply terminal from, the supply terminal of the low voltage VSS_int based on the second enable signal PG_EN2. When the supply terminal of the ground voltage VSS is electrically connected to the supply terminal of the low voltage VSS_int through the fourth power gating circuit 233B, the supply terminal of the low voltage VSS_int may have almost the same voltage level as the ground voltage VSS. For example, the low voltage VSS_int may correspond to a difference between the ground voltage VSS and a threshold voltage of a transistor included in the fourth power gating circuit 233B. When the supply terminal of the ground voltage VSS is electrically disconnected from the supply terminal of the low voltage VSS_int by the fourth power gating circuit 233B, the supply terminal of the low voltage VSS_int may be in a floating state.

The second logic circuit 233C may be coupled to the supply terminal of the power source voltage VDD, the supply terminal of the ground voltage VSS, the supply terminal of the high voltage VDD_int and the supply terminal of the low voltage VSS_int. For example, the second logic circuit 233C may include a generation path of the first read control signal PIN. The generation path of the first read control signal PIN may include a plurality of logic elements, for example, a NAND gate and an inverter, that are coupled in series to each other. Odd-numbered logic elements, for example, the NAND gate, of the logic elements may be coupled between the supply terminal of the power source voltage VDD and the supply terminal of the low voltage VSS_int. Even-numbered logic elements, for example, the inverter, of the logic elements may be coupled between the supply terminal of the high voltage VDD_int and the supply terminal of the ground voltage VSS. In addition, the second logic circuit 233C may include an input path of the read enable signal STB. The input path of the read enable signal STB may include a plurality of logic elements, for example, an inverter. Odd-numbered logic elements of the logic elements may be coupled between the supply terminal of the high voltage VDD_int and the supply terminal of the ground voltage VSS. Even-numbered logic elements of the logic elements may be coupled between the supply terminal of the power source voltage VDD and the supply terminal of the low voltage VSS_int. The second logic circuit 233C may generate the first read control signal PIN based on the read enable signal STB. For example, the second logic circuit 233C may latch and output the first read control signal PIN based on the read enable signal STB.

Although not illustrated, the read path controller 233 may include a circuit for generating the second read control signal POUT, which may have the zigzag type of power gating structure as described above.

Figure 9:
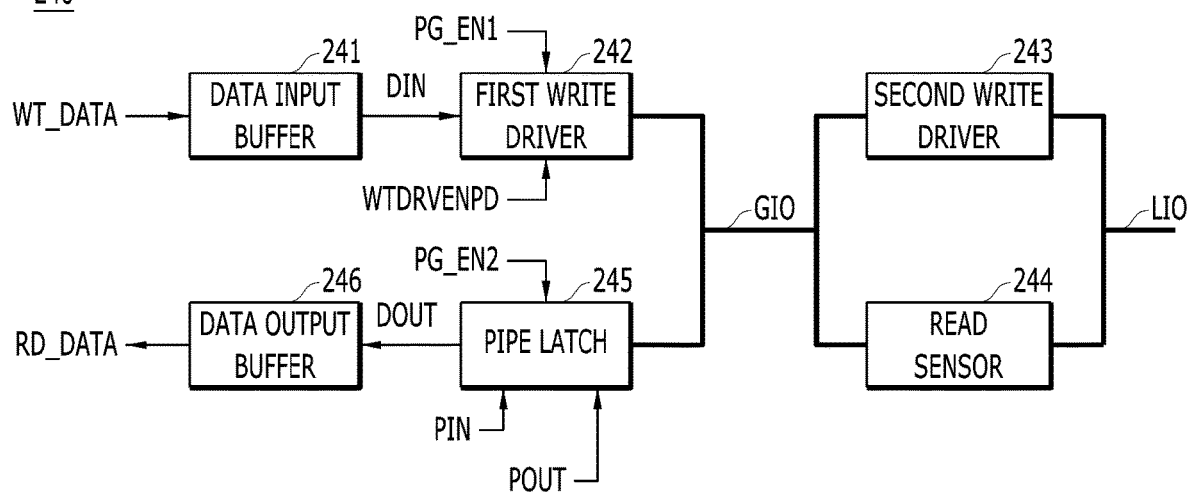
FIG. 9 is a block diagram illustrating a data input/output block, such as that shown in FIG. 3, in accordance with an embodiment of the present invention.

FIG. 9 is a block diagram illustrating a data input/output block, e.g., the data input/output block 240 shown in FIG. 3, in accordance with an embodiment of the present invention.

Referring to FIG. 9, the data input/output block 240 may include data input paths 241, 242 and 243 which refer to data write paths, and data output paths 244, 245 and 246 which refer to data read paths.

The data input paths may be enabled in the write mode WR, and may include a data input buffer 241, a first write driver 242, and a second write driver 243. The data input buffer 241 may output an input data signal DIN based on the write data signal WR_DATA. The first write driver 242 may receive the input data signal DIN, and transmit the input data signal DIN to a global input/output line GIO based on the write control signal WTDRVENPD and the first enable signal PG_EN1. The second write driver 243 may transmit the data signal received through the global input/output line GIO to the memory block 250 of FIG. 3 through the local input/output line LIO.

The data output paths may be enabled in the read mode RD, and may include a read sensor 244, a pipe latch 245, and a data output buffer 246. The read sensor 244 may transmit the data signal read from the memory block 250 through the local input/output line LIO to the global input/output line GIO. The pipe latch 245 may latch the data signal received through the global input/output line GIO based on the first read control signal PIN, the second read control signal POUT and the second enable signal PG_EN2. The data output buffer 246 may output the read data signal RD_DATA based on an output data signal DOUT latched in the pipe latch 245.

Figure 10:
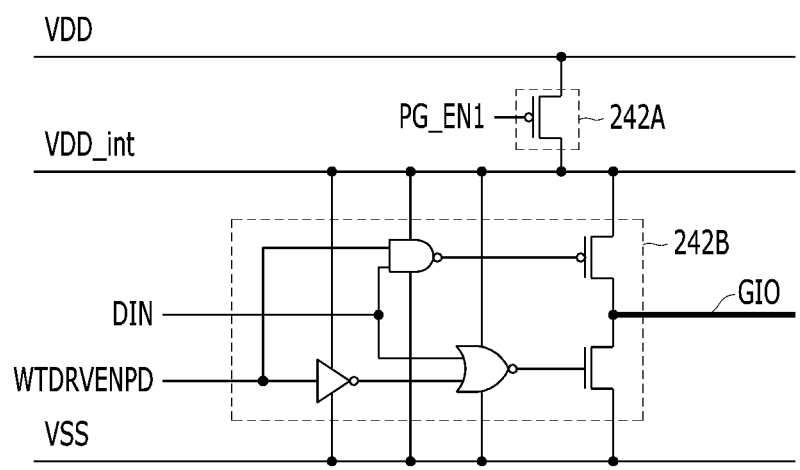
FIG. 10 is a diagram illustrating a first write driver, such as that shown in FIG. 9, in accordance with an embodiment of the present invention.

FIG. 10 is a diagram illustrating a first write driver, e.g., the first write driver 242 shown in FIG. 9, in accordance with an embodiment of the present invention.

Referring to FIG. 10, the first write driver 242 may include a fifth power gating circuit 242A, and a third logic circuit 242B. In other words, the first write driver 242 may have the header-only type of power gating structure.

The fifth power gating circuit 242A may be coupled between the supply terminal of the power source voltage VDD and the supply terminal of the high voltage VDD_int. The fifth power gating circuit 242A may electrically connect the supply terminal of the power source voltage VDD to, or disconnect such supply terminal from, the supply terminal of the high voltage VDD_int based on the first enable signal PG_EN1. When the supply terminal of the power source voltage VDD is electrically connected to the supply terminal of the high voltage VDD_int through the fifth power gating circuit 242A, the supply terminal of the high voltage VDD_int may have almost the same voltage level as the power source voltage VDD. For example, the high voltage VDD_int may correspond to a difference between the power source voltage VDD and a threshold voltage of a transistor included in the fifth power gating circuit 242A. When the supply terminal of the power source voltage VDD is electrically disconnected from the supply terminal of the high voltage VDD_int by the fifth power gating circuit 242A, the supply terminal of the high voltage VDD_int may be in a floating state.

The third logic circuit 242B may be coupled between the supply terminal of the high voltage VDD_int and the supply terminal of the ground voltage VSS. The third logic circuit 242B may drive the global input/output line GIO with the high voltage VDD_int or the ground voltage VSS based on the input data signal DIN and the write control signal WTDRVENPD.

Figure 11:
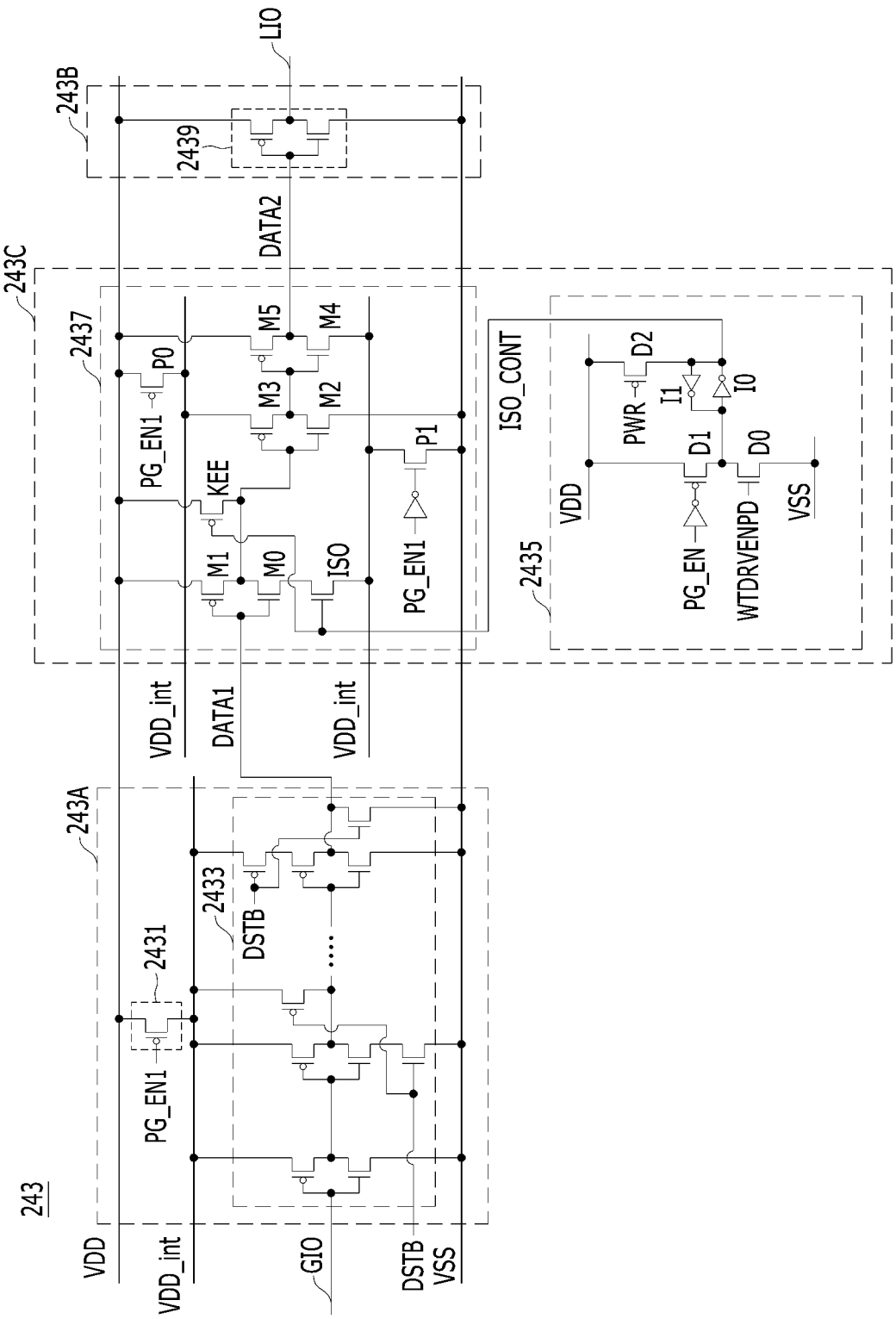
FIG. 11 is a circuit diagram illustrating a second write driver, such as that shown in FIG. 9, in accordance with an embodiment of the present disclosure.

FIG. 11 is a circuit diagram illustrating a second write driver, e.g., the second write driver 243 shown in FIG. 9, in accordance with an embodiment of the present disclosure.

Referring to FIG. 11, the second write driver 243 may include a first circuit 243A, a second circuit 243B and a third circuit 243C.

The first circuit 243A may have the header-only type of power gating structure. The first circuit 243A may generate a first write data signal DATA1, which corresponds to a data signal, based on a data strobe signal DSTB. The data signal may be inputted to the first circuit 243A through the global input/output line GIO. For example, the first circuit 243A may include a power gating circuit 2431 and a logic circuit 2433.

The power gating circuit 2431 may be coupled between the supply terminal of the power source voltage VDD and the supply terminal of the high voltage VDD_int. The power gating circuit 2431 may electrically couple or decouple the supply terminal of the power source voltage VDD to or from the supply terminal of the high voltage VDD_int based on the first enable signal PG_EN1. When the supply terminal of the power source voltage VDD and the supply terminal of the high voltage VDD_int are electrically coupled to each other through the power gating circuit 2431, the supply terminal of the high voltage VDD_int may have almost the same voltage level as the power source voltage VDD. For example, the high voltage VDD_int may correspond to a difference between the power source voltage VDD and a threshold voltage of a transistor included in the power gating circuit 2431. When the supply terminal of the power source voltage VDD and the supply terminal of the high voltage VDD_int are electrically decoupled from each other by the power gating circuit 2431, the supply terminal of the high voltage VDD_int may be in a floating state.

The logic circuit 2433 may be coupled between the supply terminal of the high voltage VDD_int and the supply terminal of the ground voltage VSS. The logic circuit 2433 may generate the first write data signal DATA1 based on the data strobe signal DSTB, and transmit the first write data signal DATA1 to the third circuit 243C.

The second circuit 243B may transmit a second write data signal DATA2 to the memory block 250. For example, the second circuit 243B may include a driver 2439.

The driver 2439 may be coupled between the supply terminal of the power source voltage VDD and the supply terminal of the ground voltage VSS. The driver 2439 may receive the second write data signal DATA2, and drive the local input/output line LIO with the power source voltage VDD or the ground voltage VSS based on the second write data signal DATA2.

The third circuit 243C may have the zigzag type of power gating structure. The third circuit 243C may generate the second write data signal DATA2, which corresponds to the first write data signal DATA1, during an operation period according to the write mode WR. The third circuit 243C may isolate the second circuit 243B from the first circuit 243A during a particular period. That is, the third circuit 243C may fix an input terminal of the second circuit 243B to a predetermined voltage level during the particular period. The particular period may correspond to the power-down mode PDE. For example, the third circuit 243C may include an isolation control circuit 2435 and an isolation circuit 2437.

The isolation control circuit 2435 may generate a control signal ISO_CONT based on the write control signal WTDRVENPD and the power-down control signal PG_EN. For example, the isolation control circuit 2435 may include a first driving element D0, a second driving element D1, a latch element I0 and I1, and an initialization element D2.

The first driving element D0 may be coupled between the supply terminal of the ground voltage VSS and a control terminal. The first driving element D0 may drive the control terminal with the ground voltage VSS based on a first mode control signal. The first mode control signal may be the write control signal WTDRVENPD. For example, the first driving element D0 may include an NMOS transistor.

The second driving element D1 may be coupled between the supply terminal of the power source voltage VDD and the control terminal. The second driving element D1 may drive the control terminal with the power source voltage VDD based on a second mode control signal. The second mode control signal may be the power-down control signal PG_EN. Alternatively, the second mode control signal may be the data signal inputted through the global input/output line GIO. When the data signal is used as the second mode control signal, the data signal has to be fixed to a predetermined logic level during a period corresponding to the power-down mode PDE. For example, the second driving element D1 may be implemented with a PMOS transistor.

The latch element I0 and Ti may be coupled between the control terminal and an output terminal of the control signal ISO_CONT. The latch element I0 and Ti may latch the control signal ISO_CONT. For example, the latch element I0 and Ti may include a first inverter I0 and a second inverter I1.

The initialization element D2 may be coupled between the supply terminal of the power source voltage VDD and the output terminal of the control signal ISO_CONT. The initialization element D2 may initialize the control signal ISO_CONT with the power source voltage VDD based on a power-up signal PWR. For example, the initialization element D2 may be implemented with a PMOS transistor.

The isolation circuit 2437 may be coupled between an output terminal of the first circuit 243A and the input terminal of the second circuit 243B. The isolation circuit 2437 may isolate the second circuit 243B from the first circuit 243A based on the control signal ISO_CONT. For example, the isolation circuit 2437 may include a first power gating element P0, a second power gating element P1, a first driver M0 and M1, an isolation element ISO, a keeping element KEE, a second driver M2 and M3, and a third driver M4 and M5.

The first power gating element P0 may be coupled between the supply terminal of the power source voltage VDD and the supply terminal of the high voltage VDD_int. The first power gating element P0 may electrically couple or decouple the supply terminal of the power source voltage VDD to or from the supply terminal of the high voltage VDD_int based on the first enable signal PG_EN1. When the supply terminal of the power source voltage VDD and the supply terminal of the high voltage VDD_int are electrically coupled to each other through the first power gating element P0, the supply terminal of the high voltage VDD_int may have almost the same voltage level as the power source voltage VDD. For example, the high voltage VDD_int may correspond to a difference between the power source voltage VDD and a threshold voltage of a transistor included in the first power gating element P0. When the supply terminal of the power source voltage VDD and the supply terminal of the high voltage VDD_int are electrically decoupled from each other by the first power gating element P0, the supply terminal of the high voltage VDD_int may be in a floating state. For example, the first power gating element P0 may electrically couple the supply terminal of the power source voltage VDD to the supply terminal of the high voltage VDD_int during the operation period corresponding to the write mode WR, and electrically decouple the supply terminal of the power source voltage VDD from the supply terminal of the high voltage VDD_int during the particular period corresponding to the power-down mode PDE.

The second power gating element P1 may be coupled between the supply terminal of the ground voltage VSS and the supply terminal of the low voltage VSS_int. The second power gating element P1 may electrically couple or decouple the supply terminal of the low voltage VSS_int to or from the supply terminal of the ground voltage VSS based on an inverted signal of the first enable signal PG_EN1. When the supply terminal of the ground voltage VSS and the supply terminal of the low voltage VSS_int are electrically coupled to each other through the second power gating element P1, the supply terminal of the low voltage VSS_int may have almost the same voltage level as the ground voltage VSS. For example, the low voltage VSS_int may correspond to a difference between the ground voltage VSS and a threshold voltage of a transistor included in the second power gating element P1. When the supply terminal of the ground voltage VSS and the supply terminal of the low voltage VSS_int are electrically decoupled from each other by the second power gating element P1, the supply terminal of the low voltage VSS_int may be in a floating state. For example, the second power gating element P1 may electrically couple the supply terminal of the ground voltage VSS to the supply terminal of the low voltage VSS_int during the operation period corresponding to the write mode WR, and electrically decouple the supply terminal of the ground voltage VSS from the supply terminal of the low voltage VSS_int during the particular period corresponding to the power-down mode PDE.

The first driver M0 and M1 may be coupled between the supply terminal of the power source voltage VDD and the isolation element ISO. The first driver M0 and M1 may receive the first write data signal DATA1.

The isolation element ISO may be coupled between the supply terminal of the low voltage VSS_int and the first driver M0 and M1. The isolation element ISO may electrically couple the supply terminal of the low voltage VSS_int and the first driver M0 and M1 during the operation period, and electrically decouple the supply terminal of the low voltage VSS_int from the first driver M0 and M1 during the particular period, based on the control signal ISO_CONT. The isolation element ISO may electrically decouple the supply terminal of the low voltage VSS_int from the first driver M0 and M1 during the particular period, thereby preventing a short circuit current that may occur through the first driver M0 and M1 when the output terminal of the first circuit 243A floats. For example, the isolation element ISO may be implemented with an NMOS transistor.

The keeping element KEE may be coupled between the supply terminal of the power source voltage VDD and the output terminal of the first driver M0 and M1. The keeping element KEE may electrically decouple the supply terminal of the power source voltage VDD from the output terminal of the first driver M0 and M1 during the operation period, and electrically couple the supply terminal of the power source voltage VDD to the output terminal of the first driver M0 and M1 during the particular period, based on the control signal ISO_CONT. The keeping element KEE may electrically couple the supply terminal of the power source voltage VDD to the output terminal of the first driver M0 and M1 during the particular period, thereby fixing the input terminal of the second circuit 243B to a predetermined voltage level, for example, a high logic level. Since the input terminal of the second circuit 243B does not float but is fixed to the predetermined voltage level, a short circuit current that may occur through the second circuit 243B during the particular period may be prevented. For example, the keeping element KEE may be implemented with a PMOS transistor.

The second driver M2 and M3 may be coupled between the supply terminal of the high voltage VDD_int to the supply terminal of the ground voltage VSS. The second driver M2 and M3 may receive an output signal of the first driver M0 and M1.

The third driver M4 and M5 may be coupled between the supply terminal of the power source voltage VDD and the supply terminal of the low voltage VSS_int. The third driver M4 and M5 may receive an output signal of the second driver M2 and M3, and output the second write data signal DATA2.

The second driver M2 and M3 may have a size smaller than that of the third driver M4 and M5, for example, a width of the transistor, and the third driver M4 and M5 may have a smaller size than that of the driver 2439.

Figure 12:
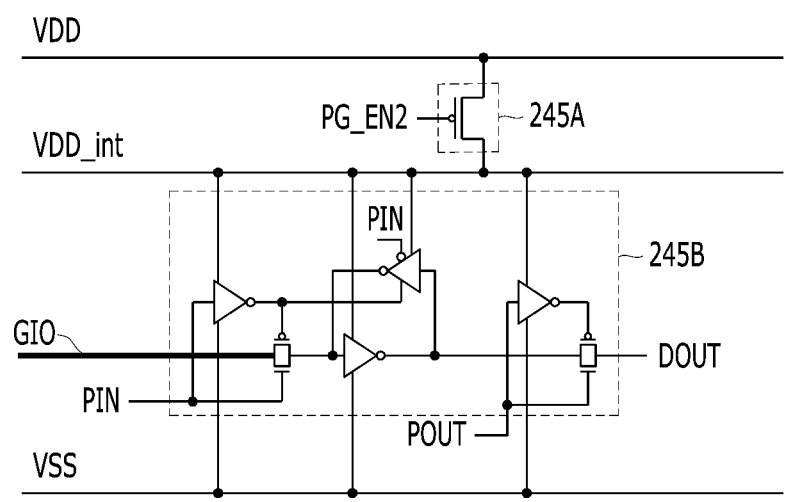
FIG. 12 is a diagram illustrating a pipe latch, such as that shown in FIG. 9, in accordance with an embodiment of the present invention.

FIG. 12 is a diagram illustrating a pipe latch, e.g., the pipe latch 245 shown in FIG. 9, in accordance with an embodiment of the present invention.

Referring to FIG. 12, the pipe latch 245 may include a sixth power gating circuit 245A, and a fourth logic circuit 245B. In other words, the pipe latch 245 may have the header-only type of power gating structure.

The sixth power gating circuit 245A may be coupled between the supply terminal of the power source voltage VDD and the supply terminal of the high voltage VDD_int. The sixth power gating circuit 245A may electrically connect the supply terminal of the power source voltage VDD to, or disconnect such supply terminal from, the supply terminal of the high voltage VDD_int based on the second enable signal PG_EN2. When the supply terminal of the power source voltage VDD is electrically connected to the supply terminal of the high voltage VDD_int through the sixth power gating circuit 245A, the supply terminal of the high voltage VDD_int may have almost the same voltage level as the power source voltage VDD. For example, the high voltage VDD_int may correspond to a difference between the power source voltage VDD and a threshold voltage of a transistor included in the sixth power gating circuit 245A. When the supply terminal of the power source voltage VDD is electrically disconnected from the supply terminal of the high voltage VDD_int by the sixth power gating circuit 245A, the supply terminal of the high voltage VDD_int may be in a floating state.

The fourth logic circuit 245B may be coupled between the supply terminal of the high voltage VDD_int and the supply terminal of the ground voltage VSS. The fourth logic circuit 245B may latch the data signal received through the global input/output line GIO based on the first read control signal PIN, and output the latched data signal as the output data signal DOUT based on the second read control signal POUT.

Hereinafter, an operation of the semiconductor system having the aforementioned structure is described.

First, an operation of the semiconductor system corresponding to the power-down mode PDE is described.

The control device 100 of FIG. 2 may generate the system control signals CS and CA<0:6> corresponding to the power-down mode PDE.

The semiconductor device 200 may internally control the power gating operation based on the system control signals CS and CA<0:6> when entering the power-down mode PDE. For example, the decoding block 210 of FIG. 3 may activate the power-down enable signal PDENP based on the system control signals CS and CA<0:6> during the power-down period. The power gating control block 220 may activate the first and second enable signals PG_EN1 and PG_EN2 based on the activated power-down enable signal PDENP. As shown in FIGS. 6 to 8, each of the first to fourth power gating circuits 231A, 2318, 233A and 233B included in the data input/output control block 230 may be disabled based on the first enable signal PG_EN1 or the second enable signal PG_EN2 during the power-down period. As shown in FIGS. 9 to 12, each of the power gating circuits 242A, 2431 and 245A included in the data input/output block 240 may be disabled based on the first enable signal PG_EN1 or the second enable signal PG_EN2 during the power-down period.

Accordingly, a leakage current caused by the data input/output control block 230 and the data input/output block 240 in the power-down mode PDE may be minimized.

Next, an operation of the semiconductor system corresponding to the write mode WR is described.

The control device 100 of FIG. 2 may generate the system control signals CS and CA<0:6> corresponding to the write mode WR.

The semiconductor device 200 may internally control the power gating operation based on the system control signals CS and CA<0:6> when entering the write mode WR. For example, the decoding block 210 of FIG. 3 may activate the write enable signal WTDRVENP based on the system control signals CS and CA<0:6> during the write period. The power gating control block 220 may deactivate the first enable signal PG_EN1 and activate the second enable signal PG_EN2 based on the activated write enable signal WTDRVENP. As shown in FIGS. 6 to 8, the first and second power gating circuits 231A and 2318 included in the data input/output control block 230 may be enabled based on the first enable signal PG_EN1 during the write period, and the third and fourth power gating circuits 233A and 233B included in the data input/output control block 230 may be disabled based on the second enable signal PG_EN2 during the write period. As shown in FIGS. 9 to 12, the fifth power gating circuit 242A included in the data input/output block 240 may be enabled based on the first enable signal PG_EN1 during the write period, the power gating circuit 2431 included in the first circuit 243A may be enabled based on the first enable signal PG_EN1 during the write period, and the sixth power gating circuit 245A included in the data input/output block 240 may be disabled based on the second enable signal PG_EN2 during the write period.

Accordingly, in the write mode WR, as the first write driver 242 has the power gating structure in which performance deterioration caused by the fifth power gating circuit 242A is almost negligible, a high-speed write operation and a reliable write operation may be realized. Further, a leakage current generated by the read path controller 233 and the pipe latch 245 in the write mode WR may be minimized.

Finally, an operation of the semiconductor system corresponding to the read mode RD is described.

The control device 100 of FIG. 2 may generate the system control signals CS and CA<0:6> corresponding to the read mode RD.

The semiconductor device 200 may internally control the power gating operation based on the system control signals CS and CA<0:6> when entering the read mode RD. For example, the decoding block 210 of FIG. 3 may activate the read enable signal STB based on the system control signals CS and CA<0:6> during the read period. The power gating control block 220 may activate the first enable signal PG_EN1 and deactivate the second enable signal PG_EN2 based on the activated read enable signal STB. As shown in FIGS. 6 to 8, the first and second power gating circuits 231A and 231B included in the data input/output control block 230 may be disabled based on the first enable signal PG_EN1 during the read period, and the third and fourth power gating circuits 233A and 233B included in the data input/output control block 230 may be enabled based on the second enable signal PG_EN2 during the read period. As shown in FIGS. 9 to 12, the fifth power gating circuit 242A included in the data input/output block 240 may be disabled based on the first enable signal PG_EN1 during the read period, the power gating circuit 2431 included in the first circuit 243A may be disabled based on the first enable signal PG_EN1 during the read period, and the sixth power gating circuit 245A included in the data input/output block 240 may be enabled based on the second enable signal PG_EN2 during the read period.

Accordingly, in the read mode RD, as the pipe latch 245 has the power gating structure in which performance deterioration caused by the sixth power gating circuit 245A is almost negligible, a high-speed read operation and a reliable read operation may be realized. Further, a leakage current generated by the write path controller 231 and the first write driver 242 in the read mode RD may be minimized.

As described above, a semiconductor device may internally control a power gating operation. Specifically, as a header-only type of power gating structure is applied to a data path of the semiconductor device and a zigzag type of power gating structure is applied to a control path of the semiconductor device, performance deterioration of a semiconductor system caused by a power gating circuit may be minimized.

In accordance with embodiments of the present invention, as the semiconductor device has a power gating structure which is optimally designed depending on intended use, an area overhead and performance deterioration caused by a power gating circuit may be minimized.

Also, in accordance with embodiments of the present invention, as a semiconductor device performs a power gating operation regardless of control of a control device, the processing amount of the control device and a power overhead may be minimized.

Figure 13:
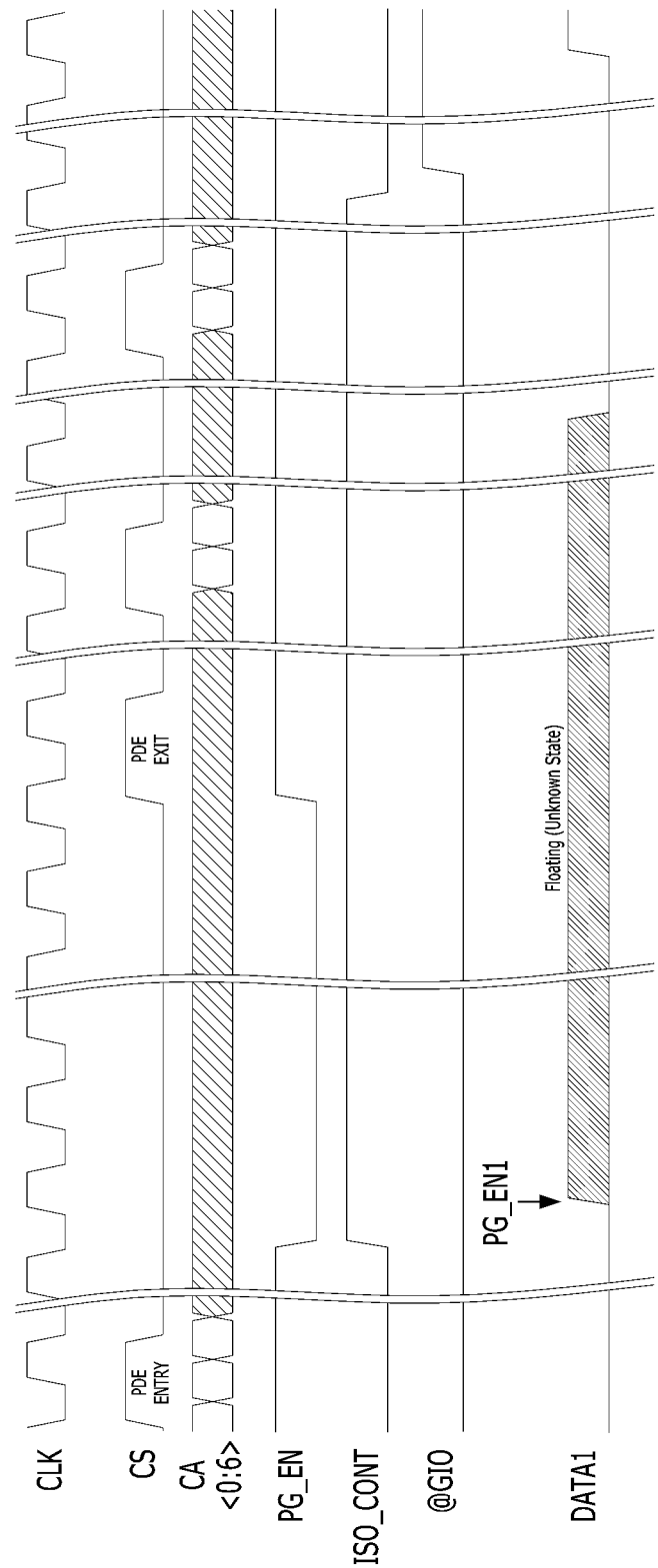
FIG. 13 is a timing diagram illustrating an operation of the second write driver, such as that shown in FIG. 11, in accordance with an embodiment of the present disclosure.

FIG. 13 is a timing diagram illustrating an operation of the second write driver 243 shown in FIG. 11, in accordance with an embodiment of the present disclosure.

Referring to FIG. 13, an operation of the semiconductor device 200 including the second write driver 243 may include entering the power-down mode PDE, isolating the second circuit 243A from the first circuit 243A at a first time point, cutting off the power of the first circuit 243A at a second time point after a predetermined delay time elapses from the first time point, and exiting from the power-down mode PDE.

The entering of the power-down mode PDE may be performed according to the combination of the first to seventh command/address signals CA<0:6> when the chip selection signal CS toggles for the first time.

The isolating of the second circuit 243B may be performed as the control signal ISO_CONT is activated at the first time point. In the isolating of the second circuit 243B, the input terminal of the second circuit 243B may be fixed to a predetermined voltage level, for example, a high logic level, and the output terminal of the second circuit 243B may also be fixed to a predetermined voltage level, for example, a low logic level.

In the cutting off of the power of the first circuit 243A, the power gating circuit 2431 included in the first circuit 243A may be enabled according to the first enable signal PG_EN1 activated at the second time point, thereby being electrically decoupled from the supply terminal of the power source voltage VDD. Accordingly, the output terminal of the first circuit 243A may float. However, the second circuit 243B may be isolated from the first circuit 243A by the third circuit 243C. Accordingly, since the input terminal of the second circuit 243B does not float and is fixed to the predetermined voltage level, for example, a high logic level, a short circuit current that may occur through the second circuit 243B may be prevented. In addition, in the isolating of the second circuit 243B, when the input terminal of the second circuit 243B is fixed to the predetermined voltage level, for example, the high logic level, the output terminal of the second circuit 243B may also be fixed to a predetermined voltage level, for example, a low logic level, thereby preventing a malfunction that may occur in the memory block 250.

The exiting from the power-down mode PDE may be performed when the chip selection signal CS toggles for the second time. Accordingly, while a power source, for example, VDD, is supplied to the first circuit 243A, the output terminal of the first circuit 243A may be initialized to a default level. In this case, the control signal ISO_CONT may be deactivated after exiting from the power-down mode PDE. That is, the control signal ISO_CONT may be deactivated after the output terminal of the first circuit 243A is initialized. For example, the control signal ISO_CONT may be deactivated as the write enable signal WTDRVENP is activated. Accordingly, it is possible to prevent a short-circuit current that may occur through the second circuit 243B and the third circuit 243C when the power-down mode PDE terminates. Although the control signal ISO_CONT is deactivated before the output terminal of the first circuit 243A is initialized due to process/voltage/temperature (PVT) variations, it is possible to minimize a short circuit current occurring through the first driver M0 and M1 having the smallest size among the first driver M0 and M1, the second driver M2 and M3 and the driver 2439.

In accordance with embodiments of the present disclosure, it is possible to prevent a short circuit current that may occur between a circuit having a power gating structure and a circuit not having a power gating structure in a power-down mode.

Also, in accordance with embodiments of the present disclosure, since a short circuit current does not occur in a power-down mode, a malfunction due to the short circuit current may be prevented.

While the present invention has been illustrated and described with respect to specific embodiments, these embodiments are not intended to be restrictive, but rather descriptive. Further, it is noted that the present invention may be achieved in various ways through substitution, change, and modification, as would be understood by those skilled in the art, without departing from the spirit and/or scope of the present invention as defined by the following claims.

What is claimed is:

1. A semiconductor device comprising:
   a memory block; and
   a write driving block having first and second power gating structures different from each other, and suitable for transmitting a data signal to the memory block by using at least third and fourth voltages supplied from the first and second power gating structures during an operation period according to a write mode and fixing an input terminal of the memory block to a set voltage level by using one of first and second voltages during a particular period according to a power-down mode,
   wherein each of the first and second power gating structures is coupled to at least one of a supply terminal of the first voltage and a supply terminal of the second voltage, and cuts off the supply of at least one of the first voltage and the second voltage in the power-down mode,
   wherein the write driving block includes:
   a first circuit having the first power gating structure, and suitable for generating, during the operation period, a first write data signal through an output terminal, which corresponds to the data signal, based on a data strobe signal, the output terminal of the first circuit being floated during the particular period;
   a second circuit suitable for transmitting a second write data signal to the input terminal of the memory block during the operation period and fixing the input terminal of the memory block to the first voltage level during the particular period; and
   a third circuit having the second power gating structure, and suitable for generating the second write data signal, which corresponds to the first write data signal, during the operation period, and fixing an input of the second circuit to a second voltage level regardless of the floated output terminal of the first circuit during the particular period.

2. The semiconductor device of claim 1, wherein the third circuit includes:
   an isolation control circuit suitable for generating a control signal based on a first mode control signal corresponding to the write mode and a second mode control signal corresponding to the power-down mode; and
   an isolation circuit coupled between an output terminal of the first circuit and an input terminal of the second circuit, and suitable for fixing the input terminal of the second circuit to the set voltage level based on the control signal.

3. The semiconductor device of claim 2, wherein the isolation circuit includes:
   a first power gating element coupled between the supply terminal of the first voltage and a supply terminal of the third voltage, and suitable for electrically decoupling the supply terminal of the first voltage from the supply terminal of the third voltage during the particular period;
   a second power gating element coupled between the supply terminal of the second voltage and a supply terminal of the fourth voltage, and suitable for electrically decoupling the supply terminal of the second voltage from the supply terminal of the fourth voltage during the particular period;

a first driver coupled between the supply terminal of the first voltage and the supply terminal of the fourth voltage, and suitable for receiving the first write data signal;

an isolation element coupled between the supply terminal of the fourth voltage and the first circuit, and suitable for electrically decoupling the supply terminal of the fourth voltage from the first circuit during the particular period based on the control signal;

a keeping element coupled between the supply terminal of the first voltage and the output terminal of the first circuit, and suitable for electrically coupling the supply terminal of the first voltage to the output terminal of the first circuit during the particular period based on the control signal; and a second driver coupled between the supply terminal of the third voltage and the supply terminal of the second voltage, and suitable for receiving an output signal of the first driver.

4. The semiconductor device of claim 3, wherein the third circuit includes a third driver coupled between the supply terminal of the first voltage and the supply terminal of the second voltage, and suitable for receiving the second write data signal, and wherein the second driver has a smaller size than the third driver.

5. The semiconductor device of claim 2, wherein the isolation control circuit includes:

a first driving element suitable for driving a control terminal with the first voltage based on the first mode control signal;

a second driving element suitable for driving the control terminal with the second voltage based on the second mode control signal; and a latch element coupled to the control terminal, and suitable for latching the control signal.

6. The semiconductor device of claim 5, wherein the isolation control circuit further includes an initialization element coupled between the supply terminal of the first voltage and the latch element, and suitable for initializing the control signal with the first voltage based on a power-up signal.

7. The semiconductor device of claim 1, wherein the first power gating structure is a header-only type of power gating structure, and the second power gating structure is a zigzag type of power gating structure.

8. The semiconductor device of claim 1, wherein at least one first power gating element included in the first power gating structure and at least two second power gating elements included in the second power gating structure are enabled during the particular period.

9. A semiconductor device comprising:

a memory block; and a write driver coupled between a global line and a local line, and suitable for transmitting data, which is received through the global line, to the memory block through the local line, wherein the write driver includes:

a first circuit coupled to the global line and having a first power gating structure, the first circuit suitable for receiving and outputting the data based on a power gating operation, an output terminal of the first circuit being floated during a particular period associated with a power-down mode;

a second circuit coupled to the local line; and a third circuit coupled between the first circuit and the second circuit, and suitable for receiving the data from the first circuit, transmitting the received data to the second circuit, and isolating the second circuit from the first circuit during the particular period such that an input terminal of the second circuit is fixed to a set voltage level regardless of the floated output terminal of the first circuit.

* * * * *